(12) United States Patent
Leu et al.

(10) Patent No.: US 7,175,328 B2
(45) Date of Patent: *Feb. 13, 2007

(54) PIEZOELECTRIC LIGHT-EMITTING DIODE AND BACKLIGHT SYSTEM USING THE SAME

(75) Inventors: Charles Leu, Fremont, CA (US);
Ga-Lane Chen, Fremont, CA (US);
Tai-Cherng Yu, Tu-Cheng (TW)

(73) Assignee: Hon Hai Precision Industry Co., Ltd. (TW)

( * ) Notice: Subject to any disclaimer, the term of this patent is extended or adjusted under 35 U.S.C. 154(b) by 101 days.

This patent is subject to a terminal disclaimer.

(21) Appl. No.: 10/951,845

(22) Filed: Sep. 27, 2004

(65) Prior Publication Data
US 2005/0088837 A1   Apr. 28, 2005

(51) Int. Cl.
*F21V 7/04* (2006.01)
(52) U.S. Cl. .................. 362/612; 362/326; 313/508
(58) Field of Classification Search ............... 362/608, 362/612–614, 326; 313/508
See application file for complete search history.

(56) References Cited

U.S. PATENT DOCUMENTS

| | | | | |
|---|---|---|---|---|
| 5,446,334 A | * | 8/1995 | Gaffney | 310/338 |
| 6,835,440 B1 | * | 12/2004 | Konishi et al. | 428/156 |
| 6,921,178 B2 | * | 7/2005 | Ohkawa | 362/620 |
| 6,976,779 B2 | * | 12/2005 | Ohtsuki et al. | 362/608 |
| 6,979,095 B2 | * | 12/2005 | Min et al. | 362/611 |
| 7,059,728 B2 | * | 6/2006 | Alasaarela et al. | 353/94 |
| 7,078,856 B2 | * | 7/2006 | Fujii | 313/508 |
| 2003/0089914 A1 | * | 5/2003 | Chen | 257/79 |
| 2005/0036319 A1 | * | 2/2005 | Gruhike et al. | 362/311 |
| 2005/0140258 A1 | * | 6/2005 | Leu et al. | 313/110 |

* cited by examiner

*Primary Examiner*—Sandra O'Shea
*Assistant Examiner*—David Makiya
(74) *Attorney, Agent, or Firm*—Morris Manning & Martin LLP; Tim Tingkang Xia, Esq.

(57) ABSTRACT

A light-emitting diode (LED) (10) includes a chip body (103), an encapsulation can (105) surrounding the chip body, and a base (106) supporting the encapsulation can and the chip body thereon. Numerous diffusion structures (1050) are provided on the encapsulation can, and the encapsulation can is made of a piezoelectric material for widening radiation angles of light beams emitted from the chip body. With the diffusion structures and the piezoelectric encapsulation can, light beams from the chip body are diffused and attain wider radiation angles. A backlight system (900) includes a light guide plate (20), and a number of the above-described LEDs disposed adjacent to the light guide plate. Light beams having wide radiation angles are emitted from the LEDs and enter the light guide plate. This enables a light emitting surface of the light guide plate to have highly uniform brightness.

19 Claims, 3 Drawing Sheets

PIEZOELECTRIC LIGHT-EMITTING DIODE AND BACKLIGHT SYSTEM USING THE SAME

BACKGROUND OF THE INVENTION

1. Field of the Invention

The present invention relates to light-emitting diodes (LEDs), and especially to an LED used in a backlight system for a device such as a liquid crystal display.

2. Description of the Prior Art

Liquid crystal displays are commonly used as the display device for compact electronic apparatuses, because they not only display good quality images using little power but also are very thin. However, the liquid crystals in a liquid crystal display do not emit any light themselves. The liquid crystals have to be lit up by a light source so as to clearly and sharply display text and images. Typically, LEDs are used as the light source because of their high luminance and low loss.

Referring to FIG. 5, a conventional LED I includes a base 16, a chip body 13 mounted on the base 16, and an encapsulation can 15 sealing the chip body 13. In general, the encapsulation can 15 is made of a transparent or translucent epoxy resin, and a maximum radiation angle of the LED 1 is 120°.

FIG. 6 shows a backlight system 90, comprising three of the LEDs 1 and a light guide plate 2. Light paths within the light guide plate 2 are also shown. Light beams 3 are projected from the LEDs 1 to an incident surface (not labeled) of the light guide plate 2. The light guide plate 2 redirects the light beams, which then emit from an emitting surface (not labeled) of the light guide plate. However, because each of the LEDs 1 emits light beams with a maximum radiation angle of 120°, resulting light beams 3 within the light guide plate 2 yield a plurality of dark areas 23 corresponding to gaps between adjacent LEDs 1. The dark areas 23 prevent the backlight system 90 from providing uniform illumination.

Therefore, it is desired to provide an LED and a backlight system using the same which overcome the above-described disadvantages of the prior art.

SUMMARY OF THE INVENTION

An object of the present invention is to provide an LED which has a large radiation angle.

Another object of the present invention is to provide a backlight system yielding uniform illumination derived from light beams originally emitted from one or more LEDs having large radiation angles.

According to a first aspect of the present invention, there is provided an LED comprising a chip body, an encapsulation can surrounding the chip body, and a base supporting the encapsulation can and the chip body thereon. A plurality of diffusion structures is provided on the encapsulation can, and the encapsulation can is made of a piezoelectric material for widening radiation angles of light beams emitted from the chip body.

According to a second aspect of the present invention, there is provided a backlight system comprising a light guide plate, and a plurality of LEDs according to the above-described LED. The LEDs are disposed adjacent to the light guide plate. Light beams having wide radiation angles are emitted from the LEDs and enter the light guide plate. This enables a light emitting surface of the light guide plate to have highly uniform brightness without any dark areas.

Other objects, advantages, and novel features of the present invention will be apparent from the following detailed description of preferred embodiments thereof with reference to the attached drawings.

DETAILED DESCRIPTION OF THE PRESENT INVENTION

Figure 1:
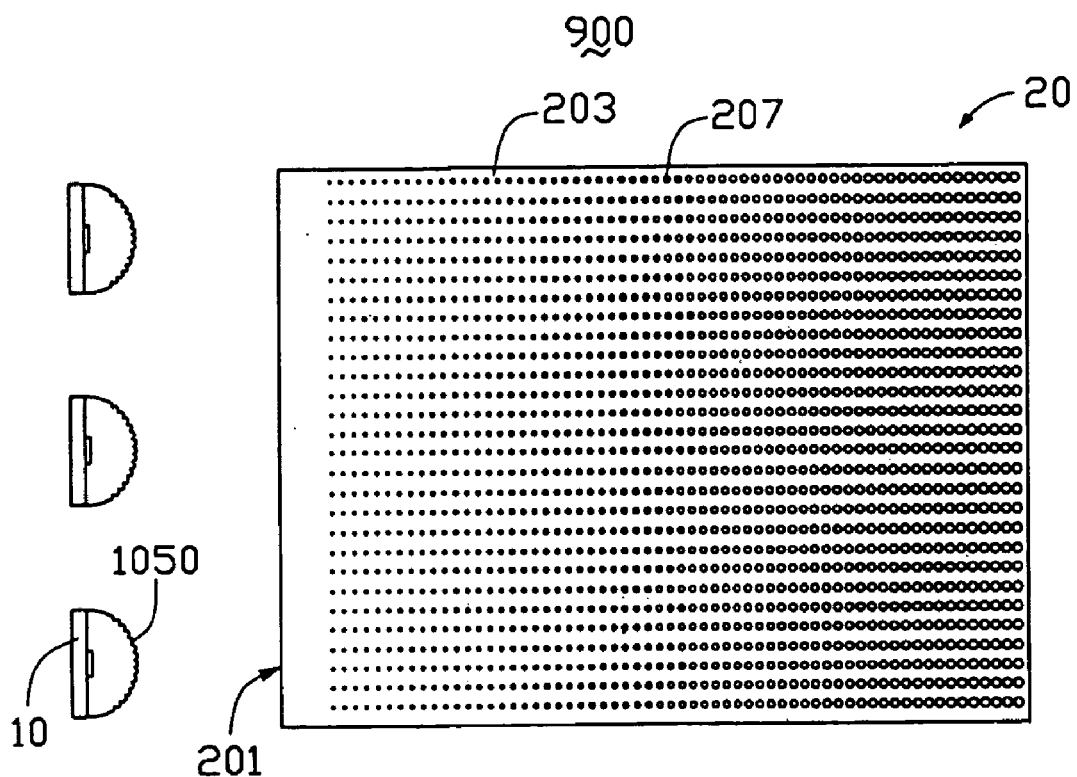
FIG. 1 is a bottom plan view of a backlight system in accordance with the present invention, the backlight system including three LEDs.

Referring to FIG. 1, a backlight system 900 in accordance with the first preferred embodiment of the present invention includes a plate-like light guide member 20 and a plurality of LEDs 10. The LEDs 10 provide light beams to the light guide plate 20, which redirects the light beams. Thus the light guide plate 20 functions to convert a series of point light sources into a uniform surface light source.

The light guide plate 20 is made of a transparent material such as acrylic resin, polycarbonate resin, polyvinyl chloride, or glass. The light guide plate 20 is a rectangular sheet, or alternatively may be generally cuneiform. The light guide plate 20 includes a light incident surface 201, an emitting surface (not labeled) connected with the light incident surface 201, and a bottom surface 203 opposite to the emitting surface. The light incident surface 201 of the light guide plate 20 receives light beams from the LEDs 10. The emitting surface of the light guide plate 20 is flat, and the bottom surface 203 of the light guide plate 20 can be formed with a plurality of dots 207. The dots 207 improve the uniformity of illumination of the light guide plate 20. Sizes of the dots 207 become progressively larger with increasing distance away from the light incident surface 201. The dots 207 may for example be hemispherical, cylindrical, cubic, cuboid, or pyramidal. In the illustrated embodiment, hemispherical dots 207 are used. Alternatively, the bottom surface 203 of the light guide plate 20 can be formed with V-cut grooves (not shown) instead of with the dots 207.

Figure 2:
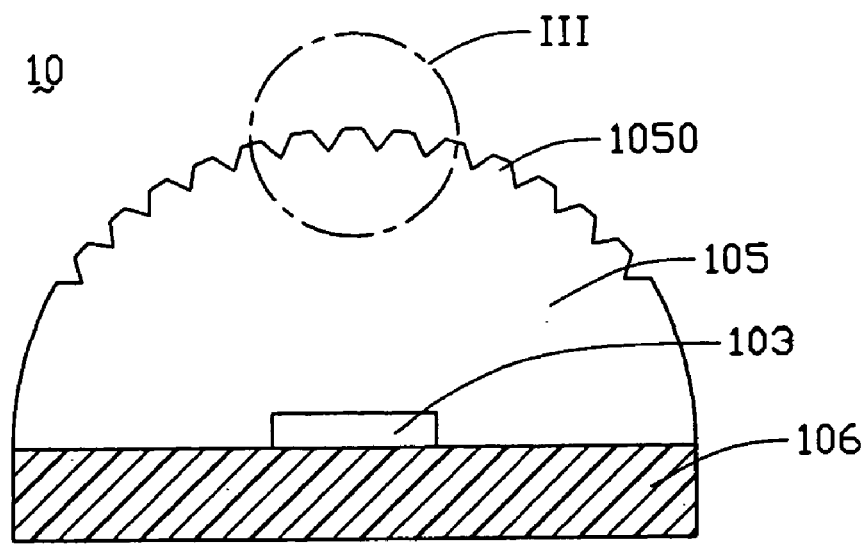
FIG. 2 is an enlarged, schematic cross-sectional view of one of the LEDs of FIG. 1.

Referring to FIGS. 1 and 2, the LEDs 10 are positioned adjacent the light incident surface 201. Each LED 10 includes a base 106, a chip body 103 fixed on the base 106, and an encapsulation can 105 covering the chip body 103. The encapsulation can 105 has a V-shaped-groove surface for light to exit out of the encapsulation can 105.

The encapsulation can 105 is made of a transparent piezoelectric material, such as a transparent piezoelectric ceramic. The encapsulation can 105 is connected to an electrical controlling circuit (not shown) to control the deformation of the encapsulation can 105. Because the encapsulation can 105 is made of the piezoelectric material, that has the characteristic of electro-mechanical coupling, the encapsulation can 105 induced to mechanically deform when an electric field is applied. When the controlling circuit is operated so that an electric field is applied on the encapsulation can 105, the dipole moment of the piezoelectric material of the encapsulation can 105 extends along the direction of the electric field.

Figure 3:
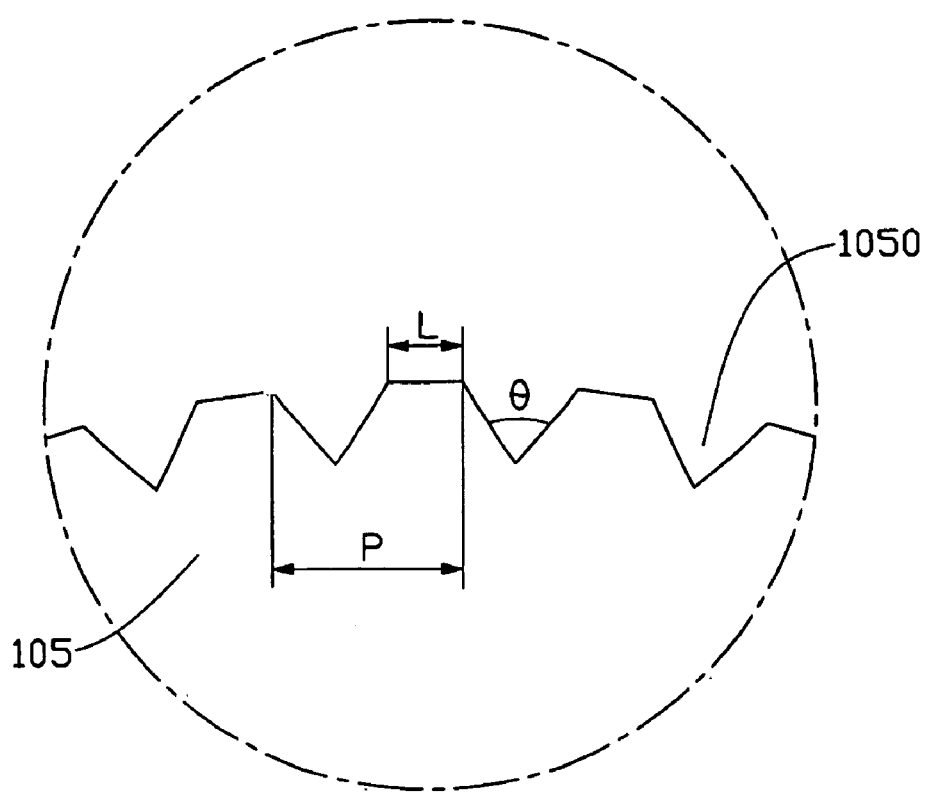
FIG. 3 is an enlarged view of a circled portion III of FIG. 2.

FIG. 3 is an enlarged view of a circled portion III of FIG. 2. A pitch between corresponding side extremities (not labeled) of two adjacent V-shaped grooves 1050 is defined as P, a distance separating two adjacent V-shaped grooves 1050 is defined as L, and a vertex angle of the V-shaped grooves 1050 is defined as θ. In order to attain good optical performance, the following specifications are provided. P is in the range from 10 to 350 μm, and is preferably 50 μm. L is in the range from 0 to 30 μm, and is preferably 30 μm. θ is in the range from 70 degrees to 140 degrees, and is preferably 80 degrees.

When an electric field (not shown) is applied on the encapsulation can 105, the encapsulation can 105 is induced to deform. P, L and θ of the V-shaped grooves 1050 vary according to the voltage used to generate the electric field. θ increases with increasing voltage. In such case, more light beams can pass through the V-shaped grooves 1050.

Figure 4:
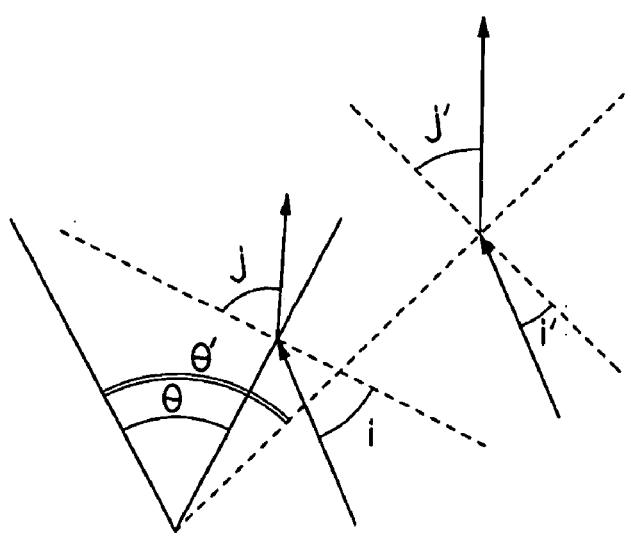
FIG. 4 is an enlarged, essential optical paths diagram of light beams at a V-shaped groove of the part of the LED shown in FIG. 3.
Figure 5:
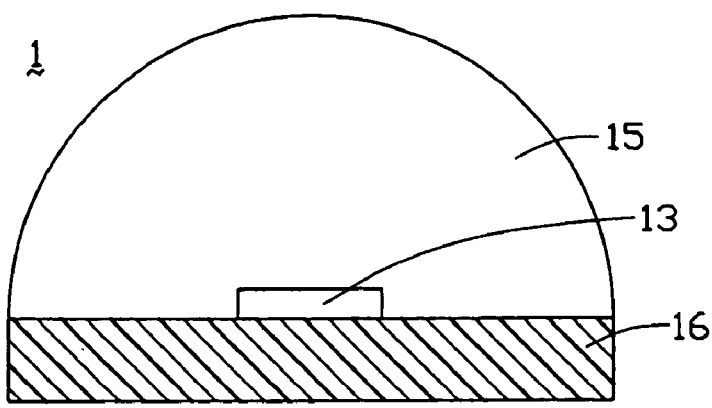
FIG. 5 is a schematic, cross-sectional view of a conventional LED.
Figure 6:
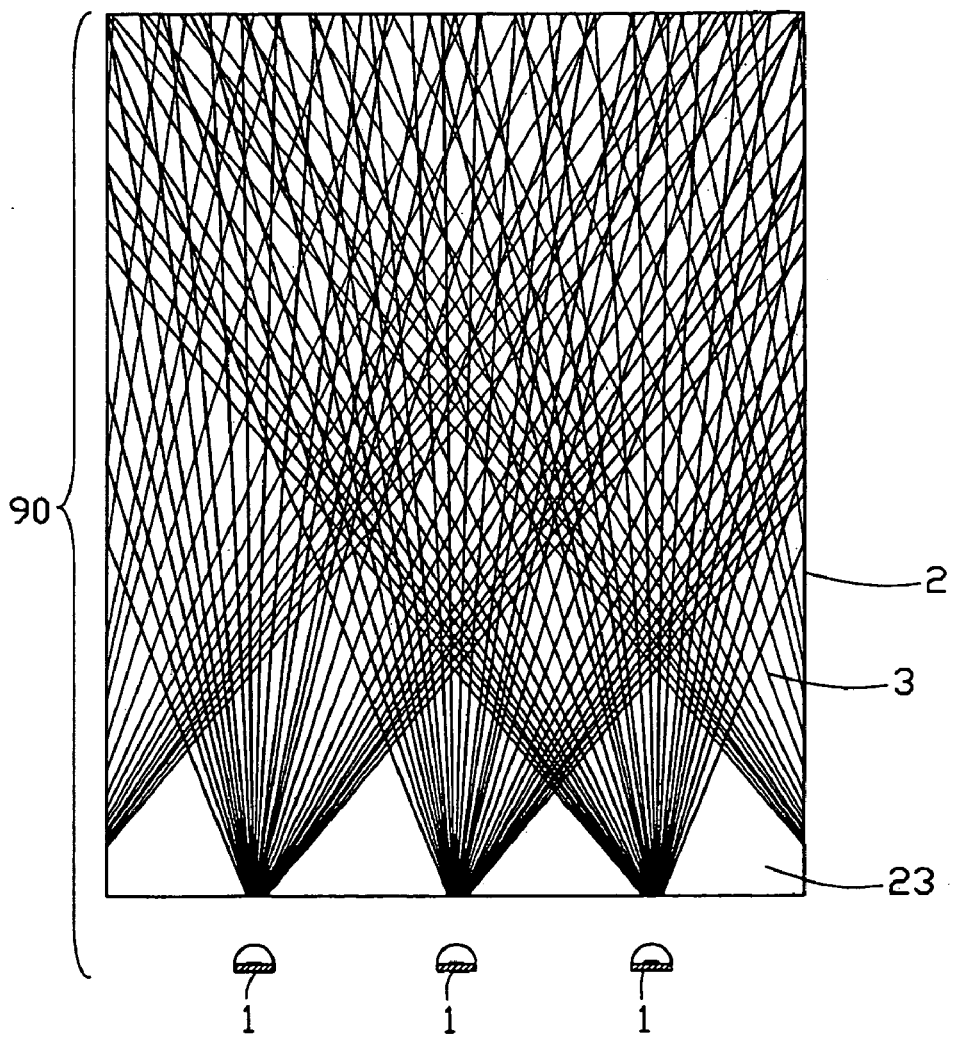
FIG. 6 is a schematic, cross-sectional view of a backlight system comprising three of the LEDs of FIG. 5 and a light guide plate, showing light paths within the light guide plate.

Referring to FIG. 4, this shows essential optical paths of light beams passing through the V-shaped grooves 1050. When an electric field is not applied on the encapsulation can 1050, the vertex angle is θ. An incident angle of light beams is defined as I, and an emergent angle of light beams is defined as J. When an electric field is applied on the encapsulation can 1050, the encapsulation can 1050 is induced to deform. θ increases to θ', the incident angle I changes to I', and the emergent angle J changes to J'. The range of all emergent angles J' is greater than the range of all emergent angles J. That is, the radiation angle of the LED 10 is widened when the electric field is applied. By adjusting the electric field, the vertex angle θ can be changed to control the radiation angle of the LED 10. Compared with the above-described conventional LED 1, light beams emitting from the LEDs 10 have wider radiation angles, and the light guide plate 20 has reduced or even no dark areas 23. The back light system 900 has excellent uniformity of brightness at the light exit surface, and provides excellent uniformity of brightness for a liquid crystal display.

In summary, by providing the V-shaped grooves 1050 on the encapsulation can 105, light beams emitted from the chip body 103 are diffused. Further, the encapsulation can 105 can be induced to deform by application of an electric field, thereby, controlling widening of the radiation angle of the LED 10. This improves the uniformity of illumination provided by the backlight module 900.

Many modifications and variations are possible within the ambit of the invention herein. For example, the V-shaped grooves 1050 can instead be Fresnel lenses or convex protrusions. More than one chip body 103 may be provided in each LED 10. The backlight system 900 may further include a diffusion sheet and a prism sheet. All such and other modifications and variations that may be apparent to a person of ordinary skill in the art are intended to be within the scope of the present invention.

It is to be further understood that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A light-emitting diode comprising:
    a base;
    a chip body fixed on the base for emitting light beams; and
    an encapsulation can covering the chip body;
    wherein a plurality of diffusion structures are provided at a surface of the encapsulation can, and the encapsulation can is made of a piezoelectric material such that radiation angles of light beams passing through the diffusion structures out of the encapsulation can are widened.

2. The light-emitting diode as claimed in claim 1, wherein the diffusion structures comprise V-shaped grooves.

3. The light-emitting diode as claimed in claim 2, further comprising an electrical circuit connected with the encapsulation can for controlling the deformation of the encapsulation can.

4. The light-emitting diode as claimed in claim 2, wherein a vertex angle of each of the V-shaped grooves is in the range from 70°~140°.

5. The light-emitting diode as claimed in claim 2, wherein a distance separating each two V-shaped grooves is in the range from 10 to 350 μm.

6. The light-emitting diode as claimed in claim 1, wherein the diffusion structures are Fresnel lenses.

7. The light-emitting diode as claimed in claim 1, wherein the diffusion structures are convex protrusions.

8. The light-emitting diode as claimed in claim 1, wherein the encapsulation can is made of piezoelectric ceramic material.

9. A backlight system comprising:
    at least one light-emitting diode comprising a base, a chip body mounted on the base for emitting light beams, and an encapsulation can mounted on the base, wherein a plurality of diffusion structures are provided at a surface of the encapsulation can, and the encapsulation can is made of a piezoelectric material such that radiation angles of light beams passing through the diffusion structures out of the encapsulation can are widened; and
    a light guide plate comprising a light incident surface adjacent to the diffusion structures in order to receive light beams therefrom, and a light exit surface.

10. The backlight system as claimed in claim 9, wherein the diffusion structures comprise V-shaped grooves.

11. The backlight system as claimed in claim 10, further comprising a circuit connected with the encapsulation can for controlling the deformation of the encapsulation can.

12. The backlight system as claimed in claim 10, wherein a vertex angle of each of the V-shaped grooves is in the range from 70°~140°.

13. The backlight system as claimed in claim 10, wherein a distance separating each two adjacent V-shaped grooves is in the range from 10 to 350 μm.

14. The backlight system as claimed in claim 9, wherein the diffusion structures are Fresnel lenses.

15. The backlight system as claimed in claim 9, wherein the diffusion structures are convex protrusions.

16. The backlight system as claimed in claim 9, wherein the encapsulation can is made of piezoelectric ceramic material.

17. A backlight system comprising:
    a light source;
    a light guide member comprising a light incident surface facing said light source so as to allow light from said light source passable through said incident surface into said light guide member for transmission thereof inside said light guide member; and a diffusion structure extendable between said light source and said incident surface of said light guide member and formed at a surface of said light source for outputting said light, and interferingly disposed around said light source to diffuse said light from said light source, said diffusion structure being stretchable in case of electrification.

18. The backlight system as claimed in claim 17, wherein said diffusion structure is made of piezoelectric ceramic material.

19. The backlight system as claimed in claim 17, wherein said diffusion structure comprises a continuous-V-shaped-groove surface.

* * * * *

UNITED STATES PATENT AND TRADEMARK OFFICE
CERTIFICATE OF CORRECTION

| | | |
|---|---|---|
| PATENT NO. | : 7,175,328 B2 | Page 1 of 1 |
| APPLICATION NO. | : 10/951845 | |
| DATED | : February 13, 2007 | |
| INVENTOR(S) | : Charles Leu, Ga-Lane Chen and Tai-Cherng Yu | |

It is certified that error appears in the above-identified patent and that said Letters Patent is hereby corrected as shown below:

On Title Page:

The following item "(30) Foreign Application Priority Data" should be added in this title page:

--(30) Foreign Application Priority Data

Oct. 22, 2003 (TW) ............... 92129254--

Signed and Sealed this

Seventh Day of August, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,175,328 B2 | Page 1 of 1 |
| APPLICATION NO. | : 10/951845 | |
| DATED | : February 13, 2007 | |
| INVENTOR(S) | : Charles Leu et al. | |

It is certified that error appears in the above-identified patent and that said Letters Patent is hereby corrected as shown below:

Please replace insert the following Foreign Application Priority Data on the cover page of the patent with the following:

On Title Page Item 30

Foreign Application Priority Data
Oct. 22, 2003   (TW) ......................... 92129254

Signed and Sealed this

Sixth Day of November, 2007

JON W. DUDAS
*Director of the United States Patent and Trademark Office*